United States Patent
Tomita et al.

(10) Patent No.: US 9,636,748 B2
(45) Date of Patent: May 2, 2017

(54) SURFACE-COATED CUTTING TOOL

(75) Inventors: Kohei Tomita, Joso (JP); Akira Osada, Tokyo (JP)

(73) Assignee: Mitsubishi Materials Corporation, Tokyo (JP)

( * ) Notice: Subject to any disclaimer, the term of this patent is extended or adjusted under 35 U.S.C. 154(b) by 110 days.

(21) Appl. No.: 14/241,681

(22) PCT Filed: Aug. 31, 2012

(86) PCT No.: PCT/JP2012/072168
§ 371 (c)(1),
(2), (4) Date: Apr. 30, 2014

(87) PCT Pub. No.: WO2013/031952
PCT Pub. Date: Mar. 7, 2013

(65) Prior Publication Data
US 2014/0287210 A1   Sep. 25, 2014

(30) Foreign Application Priority Data

Aug. 31, 2011  (JP) .................... 2011-189003
Aug. 28, 2012  (JP) .................... 2012-187859

(51) Int. Cl.
*B23B 27/14*   (2006.01)
*C23C 16/02*   (2006.01)
(Continued)

(52) U.S. Cl.
CPC .......... *B23B 27/14* (2013.01); *C23C 16/029* (2013.01); *C23C 16/0272* (2013.01);
(Continued)

(58) Field of Classification Search
None
See application file for complete search history.

(56) References Cited

U.S. PATENT DOCUMENTS 6,200,671 B1    3/2001  Lindskog et al.
7,201,956 B2 *  4/2007  Oshika ............... C23C 16/0272
                                                                428/216
(Continued)

FOREIGN PATENT DOCUMENTS

CN   1524653 A   9/2004
CN   1616169 A   5/2005
(Continued)

OTHER PUBLICATIONS

International Search Report mailed Dec. 11, 2012 for the corresponding PCT Application No. PCT/JP2012/072168.
(Continued)

*Primary Examiner* — Vera Katz
(74) *Attorney, Agent, or Firm* — Leason Ellis LLP.

(57) ABSTRACT

A surface-coated cutting tool with a hard coating layer exhibiting an excellent flaking and chipping resistance in a high-speed heavy and intermittent cutting is provided. The vapor-deposited hard coating layer has a lower layer (Ti compound layer) and an upper layer (α-type $Al_2O_3$ layer). Thirty to 70% of $Al_2O_3$ crystal grains directly above the lower layer are oriented to (11-20) plane. Forty-five % or more of all of the $Al_2O_3$ crystal grains are oriented to (0001) plane. Preferably, the outermost surface layer of the lower layer is an oxygen-containing TiCN layer having oxygen content of 0.5 to 3 atomic % only within the depth region of 500 nm. The ratio of the number of $Al_2O_3$ crystal grains directly above the outermost surface layer to the number of crystal grains of the Ti carbonitride layer in the outermost surface layer is 0.01 to 0.5 in the interface.

5 Claims, 4 Drawing Sheets

(51) Int. Cl.
 *C23C 16/40* (2006.01)
 *C23C 16/455* (2006.01)
 *C23C 28/04* (2006.01)

(52) U.S. Cl.
 CPC ...... *C23C 16/403* (2013.01); *C23C 16/45523* (2013.01); *C23C 28/042* (2013.01); *C23C 28/044* (2013.01); *Y10T 428/24975* (2015.01)

(56) References Cited

U.S. PATENT DOCUMENTS

| | | | | |
|---|---|---|---|---|
| 7,763,346 B2 * | 7/2010 | Osada | ................. | C23C 16/403 428/216 |
| 2004/0224159 A1 * | 11/2004 | Oshika | ................ | C23C 16/0272 428/408 |
| 2007/0116985 A1 * | 5/2007 | Osada | ................. | C23C 16/403 428/698 |

FOREIGN PATENT DOCUMENTS

| | | | |
|---|---|---|---|
| CN | 1748917 | A | 3/2006 |
| EP | 2409798 | | 1/2012 |
| JP | 06-008010 | A | 1/1994 |
| JP | 07-328808 | A | 12/1995 |
| JP | 3291775 | B | 6/2002 |
| JP | 3808648 | B | 8/2006 |
| JP | 2007-152491 | A | 6/2007 |
| JP | 2007-260851 | A | 10/2007 |
| JP | 2010-089201 | A | 4/2010 |
| JP | 2010-207953 | A | 9/2010 |
| WO | WO-2010/106811 | A | 9/2010 |

OTHER PUBLICATIONS

Office Action mailed Mar. 17, 2015 for the corresponding Chinese Application No. 201280042290.5.
Extended European Search Report mailed Aug. 27, 2015 for the corresponding European Application No. 12828780.2.

* cited by examiner

SURFACE-COATED CUTTING TOOL

CROSS-REFERENCE TO RELATED PATENT APPLICATIONS

This application is a U.S. National Phase application under 35 U.S.C. §371 of International Patent Application No. PCT/JP2012/072168, filed Aug. 31, 2012, and claims the benefit of Japanese Patent Applications No. 2011-189003, filed on Aug. 31, 2011 and No. 2012-187859, filed Aug. 28, 2012, all of which are incorporated by reference in their entirety herein. The International application was published in Japanese on Mar. 7, 2013 as International Publication No. WO/2013/031952 under PCT Article 21(2).

FIELD OF THE INVENTION

The present invention relates to a surface-coated cutting tool (hereinafter, referred to as a coated cutting tool) with excellent abrasion resistance over long-term use. In the coated cutting tool, a hard coating layer exhibits excellent flaking resistance and chipping resistance when cutting is performed on a wide variety of steel or cast iron under a heavy cutting conditions where a high load is applied to the cutting edge cut at a high depth of cutting and a fast feed at a high speed or under intermittent cutting conditions where an intermittent and impacting load is applied to the cutting edge at a high speed.

BACKGROUND OF THE INVENTION

Conventionally, a coated cutting tool having a vapor-deposited hard coating layer is known. The conventionally-known coated cutting tool has a body (hereinafter referred to as a cutting tool body) made of tungsten carbide-based cemented carbide (hereinafter referred to as a WC) or titanium carbonitride-based cermet (hereinafter referred to as a TiCN). It also has a vapor-deposited hard coating layer formed on the cutting tool body. The hard coating layer is constituted of (a) a lower layer that is a Ti compound layer made of one or more layers selected from a Ti carbide (hereinafter referred to as a TiC) layer, a Ti nitride (hereinafter referred to as a TiN) layer, a Ti carbonitride (hereinafter referred to as a TiCN) layer, a Ti carboxide (TiCO) layer, and Ti oxycarbonitride (TiCNO) layer, and (b) an upper layer that is an alumina layer (hereinafter referred to as a $Al_2O_3$ layer) having an α-type crystal structure in a chemically-deposited state.

The above-mentioned conventionally-known coated cutting tool exhibits excellent abrasion resistance on a variety of steel or casted iron in a continuous cutting or in an intermittent cutting. However, when it is subjected to a high-speed heavy cutting or a high-speed intermittent cutting, flaking or chipping of the coating layer is likely to occur, shortening its tool life.

Under such circumstances, in order to suppress flaking and chipping of the coating layer, various coated cutting tools with improved lower and upper layers have been proposed.

For example, Patent Literature (PTLs) 1 and 2 are known as ways to improve the lower layer. In the lower layer of the coated cutting tool described in PTL 1, the grain width of the TiCN layer of the lower layer is reduced, and the surface roughness on the surface of the hard coating layer is set to an appropriate value in order to improve its impact resistance, fracture resistance, and abrasion resistance. In the lower layer of the coated cutting tool described in PTL 2, a TiCNO layer having thickness of 2 to 18 μm is formed at least as the Ti compound layer. In the TiCNO layer, the surface with the strongest X-ray diffraction peak is a (422) surface or a (311) surface. In addition, the oxygen content in the TiCNO layer is 0.05 to 3.02 mass %. In addition to the above-described configurations, the width of TiCN crystal grains is reduced in the coated cutting tool described in PTL 2. Accordingly, coarsening of crystal grains on the surface of the hard coating layer and formation of local protrusions are intended to be prevented. Moreover, improvements in the strength of the TiCNO layer itself and adhesion between the lower and upper layers are attempted.

For example, PTLs 3 and 4 are known as ways to improve the upper layer. In the coated cutting tool described in PTL 3, improvements of abrasion resistance and fracture resistance are attempted by configuring the peak intensity of a (030) surface, I (030), in X-ray diffraction is stronger than the peak intensity of a (104) surface, I (104), in the $Al_2O_3$ layer of the upper layer. In the coated cutting tool described in PTL 4, the $Al_2O_3$ layer consisting of the upper layer is configured to be a dual-layer structure made of a top and bottom layers. Further, when a inclination distribution graphs are drawn in the range of 0 to 45° in the case of the top layer and in the range of 45 to 900 in the case of the bottom layer by measuring inclinations of the normal line of a (0001) surface using an electron field emitting scanning electron microscope, the highest peak exists in the inclination classification in the range of 0 to 15° and the sum of frequency in the range corresponds to 50% or more of total in the top layer, and the highest peak exists in the inclination classification in the range of 75 to 90° and the sum of frequency in the range corresponds to 50% or more of the total in the bottom layer. By having the dual-layer structure configured as described above, chipping resistance is improved in the coated cutting tool described in PTL 4.

RELATED ART DOCUMENTS

Patent Literature

PTL 1: Japanese Unexamined Patent Application, First Publication No. 2007-260851
PTL 2: Japanese Patent (Granted) Publication No. 3808648
PTL 3: Japanese Patent (Granted) Publication No. 3291775
PTL 4: Japanese Unexamined Patent Application, First Publication No. 2007-152491

Problems to be Solved by the Present Invention

In recently years, the performance of the cutting machines is significantly improved. On the other hand, there is a strong demand for saving energy and reducing cost in the cutting work. In responding to the demand, the cutting work is further speeded up. At the same time, the trend is inclined to the cutting work in which a high load is applied to the cutting edge as in the heavy cutting, the intermittent cutting, or the like with a high depth of cutting or a fast feed. When the above-mentioned conventionally known coated cutting tool is used for the heavy or intermittent cutting on steels or casted iron in the normal condition, there would be no particular problem. However, when it is used for a high-speed heavy cutting or a high-speed intermittent cutting, the adhesion strength between the lower layer made of the Ti compound layer consisting of the hard coating layer, and the upper layer made of the $Al_2O_3$ layer consisting of the hard coating layer, is not sufficient. Therefore, anomalous damage, such as flaking between the upper and lower layers, chipping, and the like, occurs, the cutting tool being reached to the tool life in a relatively short period of time.

Means to Solving the Problems

Under the circumstance described above, the inventors of the present invention conducted an intensive study in order to improve the adhesion between the lower layer made of the Ti compound layer and the upper layer made of the $Al_2O_3$ layer for the sake of preventing occurrence of the anomalous damage such as flaking, chipping, and the like, and lengthening the tool life.

The adhesion between the upper and lower layers can be improved by controlling the orientation of the $Al_2O_3$ crystal grains formed directly above the most outer surface of the lower layer to reduce the density of micro-pores formed at the interface between the upper and lower layer in the coated cutting tool on which the lower made of the Ti compound layer and the upper layer made of the $Al_2O_3$ layer are formed. Furthermore, the hardness and strength of the entire upper layer can be retained at a high level by controlling orientation of the $Al_2O_3$ crystal grains forming the entire upper layer. By controlling the orientations of the $Al_2O_3$ as explained above, occurrence of the anomalous damage such as flaking between the upper and lower layers, chipping, or the like, can be suppressed, even if the coated cutting tool was used for the high speed heavy cutting or the high speed intermittent cutting in which a high load and a high impact are applied to its cutting edge. Thus, the coated cutting that exhibits an excellent cutting performance over long-term use can be obtained.

SUMMARY OF THE INVENTION

The present invention is made based on the finding described above, and has aspects shown below.

(1) A surface-coated cutting tool including:
a cutting tool body made of tungsten carbide-based cemented carbide or titanium carbonitride-based cermet; and
a hard coating layer vapor-deposited on a surface of the cutting tool body, wherein
the hard coating layer includes a lower layer formed on the surface of the cutting tool body and an upper layer formed on the lower layer,
(a) the lower layer is a Ti compound layer, which is consists of one or more layers selected from the group consisting of a Ti carbide layer, a Ti nitride layer, a Ti carbonitride layer, a Ti carboxide layer, and a Ti oxycarbonitride layer, with a total average thickness of 3 to 20 μm,
(b) the upper layer is an $Al_2O_3$ layer, which has an α-type crystal structure in a chemically vapor-deposited state, with an average thickness of 2 to 15 μm,
(c) in a case of:
preparing a polished cross section of the surface-coated cutting tool perpendicular to the surface of the cutting tool body;
irradiating an electron beam to each of hexagonal $Al_2O_3$ crystal grains of the upper layer contacting to an interface between an outermost surface layer of the lower layer and the upper layer within a measurement area on the polished cross section with an electric field emitting scanning electron microscope; and
measuring inclinations of normal lines of (11-20) planes of the hexagonal $Al_2O_3$ crystal grains relative to a normal line of the surface of the cutting tool body, an area ratio occupied by hexagonal $Al_2O_3$ crystal grains having the inclinations of the normal lines of (11-20) planes being 0 to 100 is in a range of 30 to 70 area %,
(d) in a case of:
irradiating an electron beam to each of hexagonal $Al_2O_3$ crystal grains of the entire upper layer within a measurement area on the polished cross section with an electric field emitting scanning electron microscope; and
measuring inclinations of normal lines of (0001) planes of the hexagonal $Al_2O_3$ crystal grains relative to a normal line of the surface of the cutting tool body,
an area ratio occupied by hexagonal $Al_2O_3$ crystal grains having the inclinations of the normal lines of (0001) planes being 0 to 10° is 45 area % or more.

(2) The surface-coated cutting tool according to (1) described above, wherein
the outermost surface layer of the lower layer is made of the Ti carbonitride layer having a thickness of 500 nm or more,
oxygen is only included within a depth region of 500 nm of the Ti carbonitride layer in the thickness direction from an interface between the Ti carbonitride layer and the upper layer, and
an average oxygen content within the depth region is 0.5 to 3 atomic % with respect to a total atomic content of Ti, C, N, and O included within the depth region.

(3) The surface-coated cutting tool according to (2) described above, wherein a ratio of the number of $Al_2O_3$ crystal grains directly above the outermost surface layer of the lower layer to the number of crystal grains of the Ti carbonitride layer in the outermost surface layer of the lower layer is 0.01 to 0.5 at the interface between the Ti carbonitride layer, which constitutes the outermost surface layer of the lower layer, and the upper layer.

Effects of the Invention

In the coated tool, which is an aspect of the present invention (hereinafter referred to as a coated tool of the present invention), an oxygen-containing TiCN layer is formed on the outermost surface of the lower layer of the hard coating layer, for example. Also, $Al_2O_3$ crystal grains oriented to a (11-20) plane in a predetermined area ratio are formed directly above the interface. Also, the upper layer including $Al_2O_3$ crystal grains oriented to a (0001) plane in a predetermined area ratio with respect to the entire upper layer is formed. Because of configurations described above, the orientation of the $Al_2O_3$ crystal grains directly above the outermost surface layer of the lower layer and the orientation of $Al_2O_3$ crystal grains in the entire upper layer are controlled. More preferably, the ratio of numbers of crystal grains at the interface between the lower and upper layers is controlled in the coated tool of the present invention. Because of this, the adhesion strength between the lower layer and upper layers constituting the hard coating layer of the coated tool can be improved. Therefore, the coated cutting tool of the present invention shows an excellent a high-temperature strength and a high-temperature hardness to exhibit an excellent cutting performance over long-term use without occurrence of flaking or chipping of the hard coating layer even if cutting is performed under the high-speed heavy cutting condition or the high-speed intermittent cutting condition in which a high load and a high impact are applied to its cutting edge in a high-speed cutting on a variety of steel, casted iron, or the like.

BRIEF DESCRIPTION OF THE DRAWINGS

These and other features and advantages of the present invention will become more readily appreciated when considered in connection with the following detailed description and appended drawings, wherein like designations denote like elements in the various views, and wherein.

DETAILED DESCRIPTION OF THE INVENTION

Figure 1:
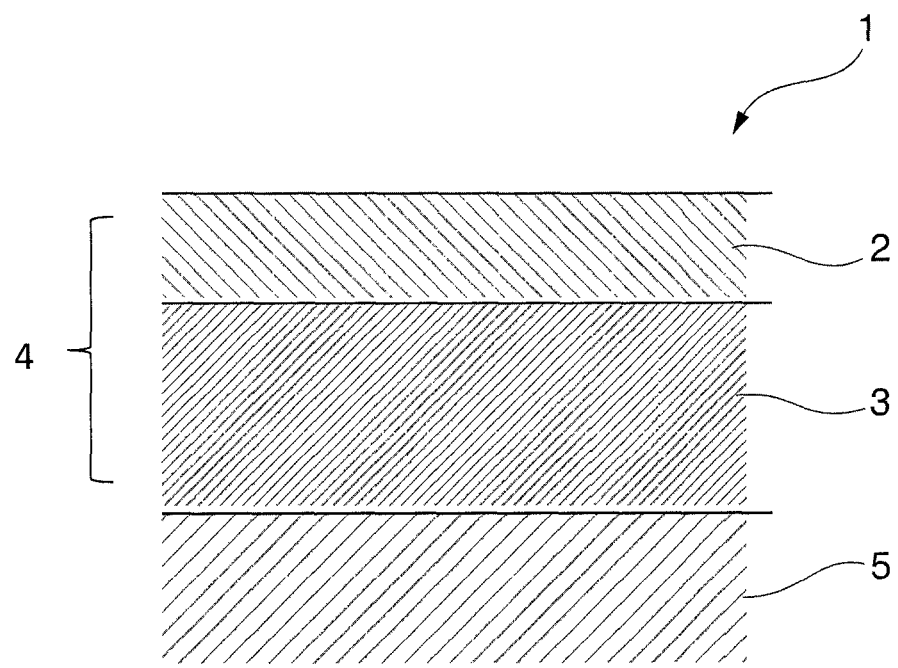
FIG. 1 is a schematic view of the cross-section perpendicular to the surface of the cutting tool body in the surface-coated cutting tool of an embodiment of the present invention.

Explanations about coated-cutting tools are indicated below as embodiments of the present invention. Particularly, each layer constituting the hard coating layer 4 of the coated-cutting tool 1 of the present embodiment is explained in detail.

(a) Ti Compound Layer (Lower Layer):

Basically, the Ti compound layer 3 (i.e., TC layer, TiN layer, TiCN layer, and TiCNO layer) exists as a lower layer of the $Al_2O_3$ layer 2. Due to its own high-temperature strength, the Ti compound layer 3 gives high-temperature strength to the hard coating layer 4. In addition, the Ti compound layer 3 adheres to both of the cutting tool body 5 and the $Al_2O_3$ layer 2. Thus, the adherence of the hard coating layer 4 to the cutting tool body 5 is retained by the action of the Ti compound layer 3. When the total thickness of the Ti compound layer 3 is less than 3 μm, the action of the Ti compound layer 3 cannot be obtained sufficiently. On the other hand, when the total thickness of the Ti compound layer 3 exceeds 20 μm, thermoplastic deformation is likely to occur in the high-speed heavy cutting or the high-speed intermittent cutting involving a high heat generation to cause uneven wear. Therefore, the total thickness of the Ti compound layer 3 is set to the range from 3 to 20 μm.

(b) Outermost Surface Layer of the Lower Layer:

For example, the outermost surface layer of the lower layer 3 is formed as explained below.

First, the Ti compound layer made of one or more of the TiC layer, the TiN layer, the TiCN layer, the TiCO layer, and the TiCNO layer is formed by vapor deposition using a conventional chemical vapor deposition equipment (this process can be done by vapor-depositing the TiCN layer alone). Then, for example, a TiCN layer including oxygen (hereinafter referred to as an oxygen-containing TiCn layer) is formed as the outermost surface layer by using the same conventional chemical vapor deposition equipment in a condition explained below.

Composition of reaction gas (volume %): 3 to 8% of $TiC_4$; 1.0 to 2.0% of $CH_3CN$; 40 to 60% of $N_2$; and balance $H_2$ Temperature of reaction atmosphere: 750 to 900° C.

Pressure of reaction atmosphere: 6 to 10 kPa

In this occasion, the chemical vapor deposition is performed while CO gas is supplemented to the reaction atmosphere so that the volume % of the CO gas becomes 1 to 5 volume % with respect to the total amount of the reaction gas at the end of the vapor deposition. CO gas is supplemented to the reaction gas for 5 to 30 minutes before the vapor deposition end point where a predetermined thickness of the layer is obtained. By following the procedures, the oxygen-containing TiCN layer containing oxygen in 0.5 to 3 atomic % within the depth region of 500 nm in its thickness direction can be formed by vapor deposition.

In order to form a suitable $Al_2O_3$ crystal grains on the outermost surface layer (see (d) explained later), preferably the outermost surface layer of the lower layer 3 made of the oxygen-containing TiCN layer is formed in the thickness of 500 nm or more at least, for example. At the same time, preferably the oxygen-containing TiCN layer is configured so that oxygen of 0.5 to 3 atomic % only exists within the depth region of 500 nm in the thickness direction of the oxygen-containing TiCN layer from the interface between the oxygen-containing TiCN layer and the upper layer 2, and the depth region of the oxygen-containing TiCN layer deeper than 500 nm is free of oxygen.

The reasons for setting the average oxygen content of the oxygen-containing TiCN layer within the depth region of 500 nm as described above are as follows. When oxygen is included within the depth region deeper than 500 nm in the depth direction of the layer, structure of the TiCN outermost surface is transformed from the columnar structure to the granular structure. Furthermore, the orientation of the $Al_2O_3$ crystal grains directly above the outermost surface layer of the lower layer 3 and the distribution state of the $Al_2O_3$ crystal grains oriented to the (11-20) plane become unwanted states.

When the average oxygen content within the depth region of 500 nm is less than 0.5 atomic %, adhesion strength between the upper layer 2 and the lower TiCN layer cannot be improved. At the same time, the orientation of the $Al_2O_3$ crystal grains directly above the outermost surface layer of the lower layer 3 and the distribution state of the $Al_2O_3$ crystal grains oriented to the (11-20) plane cannot be satisfied. On the other hand, when the average oxygen content within this depth region exceeds 3 atomic %, on the upper layer $Al_2O_3$ directly above the interface, the area ratio occupied by $Al_2O_3$ crystal grains oriented to the (0001) plane ("$Al_2O_3$ crystal grains oriented to the (0001) plane" will be explained later) becomes less than 45 area % with respect to the entire area of $Al_2O_3$ in the entire upper layer, and the high-temperature strength of the upper layer 2 is reduced.

The average oxygen concentration means the oxygen (O) content in the total content of titanium (Ti), carbon (C), nitrogen (N), and oxygen (O) represented in atomic % within the depth region of 500 nm in the thickness direction of the TiCN layer from the interface between the TiCN layer constituting the outermost surface layer of the lower layer 3 and the upper layer 2 (=O/(T+C+N+O)×100).

In PTL 2 referred as a related art, a surface-coated cutting tool, in which at least a TiCNO layer (thickness is 2 to 18 μm) is formed as the Ti compound layer and includes a lower layer, is disclosed. In the lower layer of the surface-coated cutting tool disclosed in PTL 2, oxygen content with respect to the entire TiCNO layer is set 0.05 to 3.02% by mass. In this related art, the width of the crystal grain is reduced: prevention of coursing of the crystal grains on the surface of the hard coating layer and formation of local protrusions; improvement in the strength of the TiCNO layer itself; and improvement in the adhesiveness to the upper layer are intended. However, there is no modification on the orientation of the upper layer.

In the present embodiment, the oxidation state of the outermost surface of the TiCN layer is adjusted so that the depth region of 500 nm from the interface between TiCN layer constituting the outermost surface layer of the lower layer 3 and the upper layer 2 in the thickness direction of the TiCN layer includes oxygen at 0.5 to 3 atomic % in the process before formation of the nucleus of $Al_2O_3$. In other words, the nucleus of $\alpha$-$Al_2O_3$ is formed in a condition where the grain boundary on the surface of TiCN layer and the protruded and recessed part in the crystal surface is relatively intensely oxidized in the process before formation of the nucleus of $Al_2O_3$. By varying the oxidation state of the outermost surface of the TiCN layer before the $Al_2O_3$ nucleus formation process, the nucleuses are formed in a dispersed state, and the crystal orientation of TiCN and the relative orientation of the $Al_2O_3$ nucleuses can be controlled. Thus, $Al_2O_3$ crystal grains oriented to the (11-20) plane can be formed on the grain boundary on the surface of TiCN layer and the protruded and recessed part in the crystal surface.

Since the lower layer (TiCNO layer) having layer thickness of 2 to 18 μm disclosed in the above-mentioned PTL 2 includes oxygen within the depth region deeper than 500 nm (at least within the depth region of 2 μm or deeper) in the thickness direction, the present invention is fundamentally different from the above-described related art.

(c) The above-described (b) forms the oxygen-containing TiCN layer as the outermost surface layer of the lower layer 3. However, the outermost surface layer with different configurations can be formed as explained below.

As in above-described (b), first, the Ti compound layer made of one or more of the TiC layer, the TiN layer, the TiCN layer, the TiCO layer, and the TiCNO layer is formed by vapor deposition using the conventional chemical vapor deposition equipment. Then, $AlCl_3$ gas etching is performed on the surface of the vapor-deposited lower layer 3 in the condition described below.

Composition of reaction gas (volume %): 0.1 to 1% of $AlCl_3$; and balance $H_2$
Temperature of reaction atmosphere: 750 to 900° C.
Pressure of the reaction atmosphere: 6 to 10 kPa
Time: 1 to 5 minutes Then, oxidation treatment is performed by the mixed gas of CO and NO in the condition described below.

Composition of reaction gas (volume %): 5 to 10% of CO; 5 to 10% of NO; and balance $H_2$
Temperature of reaction atmosphere: 750 to 900° C.
Pressure of the reaction atmosphere: 6 to 10 kPa
Time: 1 to 5 minutes By following the above-described processes, the nucleuses of Al compounds needed for formation of $\alpha$-$Al_2O_3$ nucleus are evenly dispersed on the outermost surface of the Ti compound layer. Thus, $\alpha$-$Al_2O_3$ nucleuses can be evenly dispersed on the outermost surface of the Ti compound layer in the pre-$Al_2O_3$ nucleus formation process.

(d) $Al_2O_3$ Crystal Grains Directly Above the Outermost Surface of the Lower Layer:

$TiCl_4$ gas etching treatment is performed on the surface of the oxygen-containing TiCN layer that is formed in above-described (b) and includes oxygen at 0.5 to 3 atomic %, or on the surface of the Ti compound layer that is formed in above-described (c) and the $\alpha$-$Al_2O_3$ nucleuses are evenly dispersed on in the condition described below, for example.

Composition of reaction gas (volume %): 1 to 5% of $TiCl_4$; 10 to 30% of $H_2$; and balance Ar
Temperature of reaction atmosphere: 750 to 900° C.
Pressure of the reaction atmosphere: 6 to 10 kPa Then, after the internal atmosphere being purged by making Ar atmosphere in the equipment, setting temperature at 750 to 900° C., pressure at 6 to 10 KPa, $Al_2O_3$ deposition is performed in the condition described below.

Composition of reaction gas (volume %): 1 to 3% of $AlCl_3$; 10 to 30% of $CO_2$; and balance $H_2$
Temperature of reaction atmosphere: 960 to 1040° C.
Pressure of the reaction atmosphere: 6 to 10 kPa
Time: 5 to 30 minutes By following the above-described processes, $Al_2O_3$ crystal grains, in which the $Al_2O_3$ crystal grains oriented to the (11-20) plane occupy 30 to 70 area % of the measurement area, are formed directly above the outermost surface layer of the lower layer 3.

Figure 2:
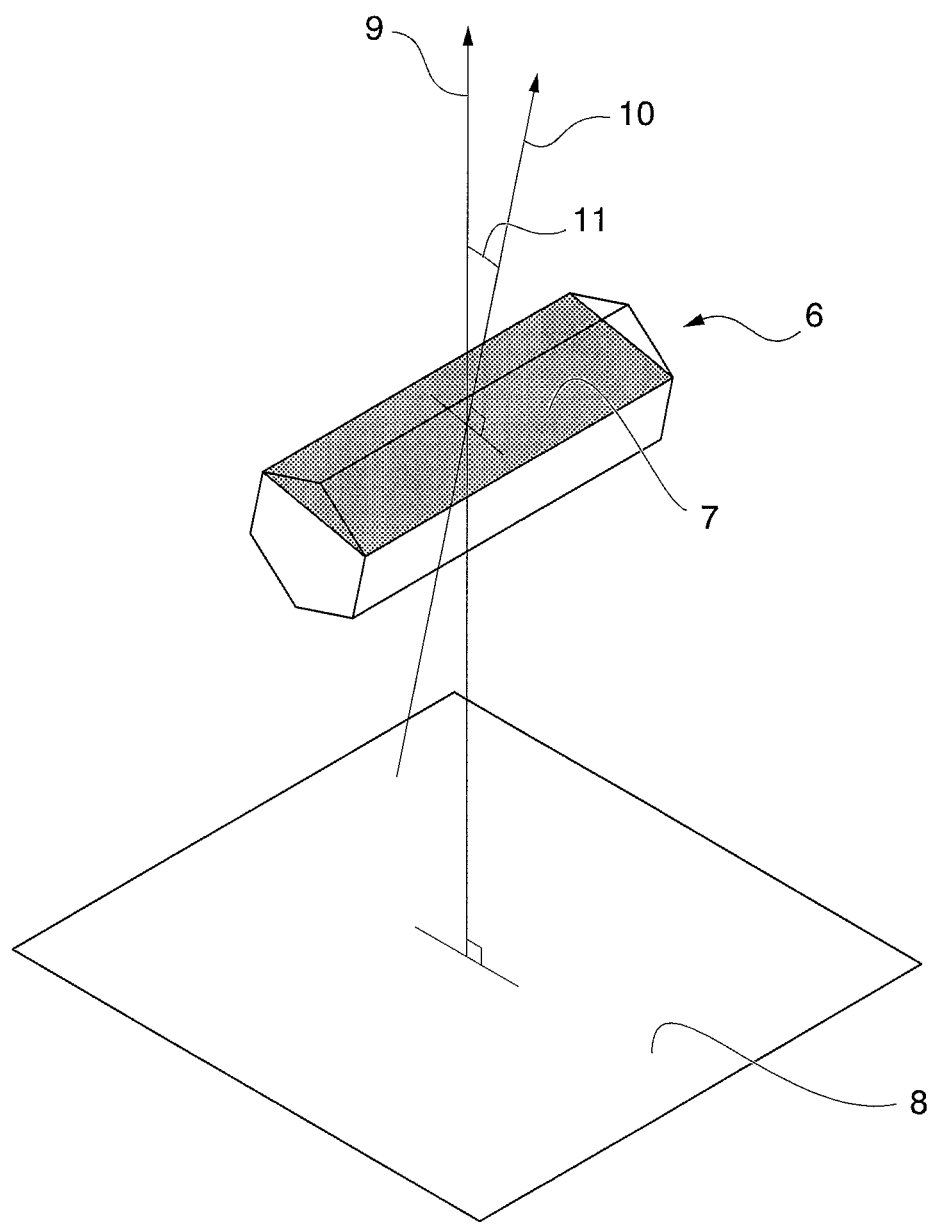
FIG. 2 is a perspective view showing the inclination of the normal line of a (11-20) plane, which is a crystal plane of $Al_2O_3$ crystal grain of the upper layer, to the normal line of the surface of the cutting tool body in the surface-coated cutting tool of an embodiment of the present invention.

The inclination 11 (see FIG. 2) of the normal line 10 of the (11-20) plane 7, which is a crystal plane of the $Al_2O_3$ crystal grain 6 of the upper layer 2, to the normal line 9 of the surface of the cutting tool body can be measured in the procedure described below.

First, the polished cross section perpendicular to the surface of the coated-cutting tool body of the present embodiment is prepared (see FIG. 1). Next, by setting the above-described (d) $Al_2O_3$ crystal grains formed directly above the outermost surface layer of the lower layer 3 (directly above the interface between the upper and lower layers) to be the measuring objects, an electron beam is irradiated to each of the $Al_2O_3$ crystal grains having the hexagonal crystal lattice existed within the measurement area with an electric field emitting scanning electron microscope to obtain data related to the orientation of the $Al_2O_3$ crystal grains 6. Then, based on the data, the inclination 11 (see FIG. 2) of the normal line 10 of the (11-20) plane 7, which is a crystal plane of the $Al_2O_3$ crystal grain 6 of the upper layer 2, to the normal line 9 of the surface of the cutting tool body is measured. Then, based on the obtained inclinations, the area ratio of crystal grains ($Al_2O_3$ crystal grains oriented to the (11-20) plane) with inclination from 0 to 10° is calculated.

The area ratio of the formed $Al_2O_3$ crystal grains oriented to the (11-20) plane obtained in above-described procedures is influenced by two factors in above-described vapor deposition condition. One is keeping the ratio of the Ar gas larger than that of $H_2$ gas in the $TiCl_4$ gas etching. Another is keeping the $CO_2$ gas amount larger than that of $AlCl_3$ gas amount in the $Al_2O_3$ deposition for 5 to 30 minutes. When the $Al_2O_3$ crystal grains oriented to the (11-20) plane is less than 30 area % of the measurement area, the vertically elongated columnar structure of the upper layer $Al_2O_3$ crystal grains 6 is formed in a lopsided state relative to the thickness direction and the fine crystal grains in the vertically elongated columnar structure are destroyed, leading to reduced adhesive strength between the upper layer $Al_2O_3$ and the lower layer 3. On the other hand, when the existence ratio of $Al_2O_3$ crystal grains oriented to the (11-20) plane exceeds 70%, the area ratio of the $Al_2O_3$ crystal grains oriented to the (0001) plane in the upper layer $Al_2O_3$ (explained later) becomes less than 45 area % with respect to the whole area of the $Al_2O_3$ crystal grains in the entire upper layer and the high-temperature strength of the upper layer $Al_2O_3$ is reduced.

Because of the reasons described above, in terms of the $Al_2O_3$ crystal grains directly above the interface between the upper layer 2 and the lower layer 3, the existence ratio of the $Al_2O_3$ crystal grains oriented to the (11-20) plane is set from 30 to 70 area %.

(e) $Al_2O_3$ Crystal Grains in the Upper Layer:

After forming the above-described (d) $Al_2O_3$ crystal grain directly above the outermost surface layer of the lower layer 3 by vapor deposition, the $Al_2O_3$ crystal grains of the upper layer are formed in the condition described below.

First, the surface of the $Al_2O_3$ crystal grains formed in above-described (d) (the $Al_2O_3$ crystal grains in which the existence ratio of the $Al_2O_3$ crystal grains oriented to (11-20) plane is set from 30 to 70 area %) is subjected to the etching treatment in the condition described below.

Composition of reaction gas (volume %): 1 to 5% of $AlCl_3$; and balance Ar
Temperature of reaction atmosphere: 960 to 1040° C.
Pressure of the reaction atmosphere: 6 to 10 kPa
Time: 1 to 5 minutes Then, vapor deposition is performed in the condition described below.

Composition of reaction gas (volume %): 1 to 5% of $AlCl_3$; 5 to 15% of $CO_2$; 1 to 5% of HCl; 0.5 to 1% of $H_2S$; and balance $H_2$
Temperature of reaction atmosphere: 960 to 1040° C.
Pressure of the reaction atmosphere: 6 to 10 kPa
Time: Until the intended layer thickness is obtained By following the above-described processes, the upper layer consisted of a special $Al_2O_3$ layer, which is described below, can be formed. The special $Al_2O_3$ layer is constituted from fine and vertically elongated columnar $Al_2O_3$ crystal grains grown in substantially parallel to the thickness direction. In addition, the area ratio of the $Al_2O_3$ crystal grains oriented to the (0001) plane is 45 area % or more with respect to the $Al_2O_3$ crystal grains in the entire upper layer in the special $Al_2O_3$ layer.

The $Al_2O_3$ crystal grains, which are described in (e), grow as fine and vertically elongated columnar $Al_2O_3$ crystal grains substantially parallel to the thickness direction. Furthermore, the $Al_2O_3$ crystal grains oriented to the (0001) plane with respect to the $Al_2O_3$ crystal grains of the entire upper layer are formed. The area ratio of the $Al_2O_3$ crystal grains oriented to the (0001) plane is influenced particularly by the adsorption amount of $AlCl_3$ gas adsorbed on the surface of $Al_2O_3$ by not purging the inside of the deposition equipment in Ar atmosphere after the etching treatment using $AlCl_3$ gas in Ar gas atmosphere.

In the present invention, the area ratio of the $Al_2O_3$ crystal grains oriented to the (0001) plane in the upper layer is set to 45 area % or higher, since the high-temperature hardness and high-temperature strength of the upper layer $Al_2O_3$ are retained when the area ratio of the formed $Al_2O_3$ crystal grains oriented to the (0001) plane is 45 area % or more.

The area ratio of the $Al_2O_3$ crystal grains oriented to the (0001) plane as described above can be obtained by following the processes explained below. First, a polished cross section of the surface-coated cutting tool perpendicular to the surface of the cutting tool body 5 of the present embodiment is prepared. Next, by setting the $Al_2O_3$ crystal grains of the entire upper layer to be the measuring objects, an electron beam is irradiated to each of the $Al_2O_3$ crystal grains having the hexagonal crystal lattice existed within the measurement area with an electric field emitting scanning electron microscope to obtain data related to the orientation of the $Al_2O_3$ crystal grains. Then, based on the data, the inclination 11 of the normal line 10 of the (0001) plane, which is a crystal plane of the $Al_2O_3$ crystal grain, to the normal line 9 of the surface of the cutting tool body is measured. Then, based on the obtained inclinations, the area ratio of crystal grains ($Al_2O_3$ crystal grains oriented to the (0001) plane) with inclination from 0 to 10° is calculated.

When the thickness of the entire upper layer is less than 2 μm, it cannot exhibit the excellent high-temperature strength and the high-temperature hardness for long-term use. On the other hand, when it exceeds 15 μm, chipping is likely to occur. Therefore, the thickness of the upper layer is set to 2 to 15 μm.

Ratio of Crystal Grain Number at the Interface Between the Lower and Upper Layers:

In the present embodiment, the ratio value of the number of $Al_2O_3$ crystal grains directly above the outermost surface layer of the lower layer 3 (it can be the oxygen-containing TiCN layer formed in above-described (b) or the Ti compound layer formed in above-described (c)) to the number of Ti compound crystal grains on the outermost surface layer of the lower layer 3 (that is (Number of $Al_2O_3$ crystal grains)/(Number of Ti compound crystal grains) contacting to the interface between the upper layer 2 and the lower layer 3) is set to the range of 0.01 to 0.5. When this value is less than 0.01, the size of the $Al_2O_3$ crystal grains becomes relatively too small leading to a reduced associativity of the Ti compound crystal grains onto the protrusions and recesses on the crystal surfaces at the interface. Consequently, the adhesive strength of $Al_2O_3$ of the upper layer 2 and the lower layer 3 is reduced, and pores are likely to be formed. On the other hand, when the value exceeds 0.5, the size of $Al_2O_3$ crystal grains becomes relatively too large leading to pore-formation during $Al_2O_3$ formation in the upper layer. Consequently, the hardness and strength of $Al_2O_3$ of the upper layer are reduced, and the adhesive strength to the Ti compound of the lower layer is reduced.

Because of the reasons described above, the ratio value of the number of $Al_2O_3$ crystal grains contacting to the interface between the upper layer 2 and the lower layer 3 to the number of Ti compound crystal grains on the outermost surface layer of the lower layer 3 ((Number of $Al_2O_3$ crystal grains)/(Number of Ti compound crystal grains)) is set to the range of 0.01 to 0.5 in the present embodiment.

Preferably, the size of the $Al_2O_3$ crystal grains 6 in the vicinity of the interface is 10 nm to 50 nm.

Figure 3:
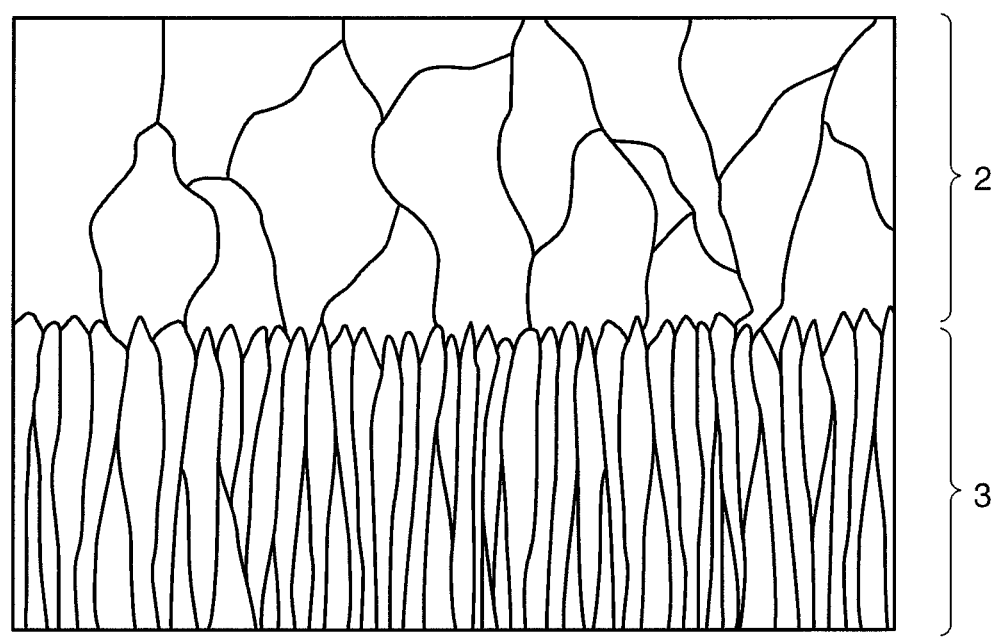
FIG. 3 is a schematic view of the interface between the upper and lower layers in the surface-coated cutting tool of an embodiment of the present invention.

The structures of the lower layer 3 and the upper layer 2 are shown in FIG. 1. The ratio of the number of crystal grains contacting to the interface between the upper layer 2 and the lower layer 3 is shown in FIG. 3.

Next, the coated cutting tool of the present invention is specifically explained by Examples.

EXAMPLES

As raw material powders, the WC powder, the TiC powder, the ZrC powder, the VC powder, the TaC powder, the NbC power, the $Cr_3C_2$ powder, the TiN powder, and the Co powder, each of which had the average size of 1 to 3 μm, were prepared. The above-mentioned raw material powders were mixed in the blend composition shown in Table 1. Then, after adding wax, the mixtures were mixed in acetone with a ball mill for 24 hours. After vacuum drying, the mixtures were press-molded into green compacts in a predetermined shape under pressure at 98 MPa. The green compacts were sintered in vacuum at 5 Pa and at a predetermined temperature from 1370 to 1470° C. for 1 hour. After sintering, the cutting edge part was honed in R of 0.07 mm. By following the above-described steps, the cutting tool bodies A to F, which were made of WC-base cemented carbide and had the through-away-chip-shape defined by the ISO-CNMG160608 standard, were manufactured.

Also, as raw material powders, the TiCN powder (TiC/TiN=50/50 in mass ratio), the $Mo_2C$ powders, the ZrC powder, the NbC powder, the TaC powder, the WC powder, the Co powder, and the Ni powder, each of which had the average size of 0.5 to 2 μm, were prepared. The above-mentioned raw material powders were mixed in the blend composition shown in Table 2. Then, the mixtures were mixed with a ball mill for 24 hours in wet mixing. After vacuum drying, the mixtures were press-molded into green compacts in a predetermined shape under pressure at 98 MPa. The green compacts were sintered in a nitrogen atmosphere at 1.3 KPa and at 1540° C. for 1 hour. After sintering, the cutting edge part was treated by chamfer honing of 0.1 mm of width and 20° of angle. By following the above-described steps, the cutting tool bodies a to f, which were made of TiCN-base cermet and had the chip-shape defined by the ISO-CNMG160608 standard, were manufactured.

Then, each of the cutting tool bodies A to F and the cutting tool bodies a to f was inserted in a conventional chemical vapor deposition equipment, and the coated cutting tools 1 to 13 of the present invention were manufactured.

(a) First, the Ti compound layers having the intended layer thickness shown in Tables 8 and 9 were vapor deposited under the conditions shown in Table 3 ("I-TiCN" in Table 3 indicates the condition for forming TiCN layer with the vertically grown crystal structure described in JP-A-H06-8010, and others show conditions for forming normal granular crystal structures).

(b1) Then, $AlCl_3$ gas etching and oxidation treatment by the mixed gas of CO and NO were performed on the outermost surface of the Ti compound layer of the lower layer under the condition shown in Table 4.

(c) Then, the surface of the Ti compound layer treated in above-described (b1) was treated by $TiCl_4$ gas etching treatment under the condition shown in Table 6. Then, the inside of the equipment was purged by Ar gas.

(d) Then, the coated cutting tools 1 to 7 were manufactured by forming the $Al_2O_3$ layer of the upper layer in the intended layer thickness shown in Table 8 under the 3-steps-condition shown in Table 7.

(b2) The oxygen-containing TiCN layer (the TiCN layer in which oxygen is only included within the depth region of 500 nm from the surface of the layer at 0.5 to 3 atomic % $(O/(Ti+PC+N+O)\times100))$ was formed as the outermost surface layer of the lower layer in the intended thickness shown in Table 9 under the condition shown in Table 5.

Then, the surface of the oxygen-containing TiCN layer formed in above-described (b2) was treated by $TiCl_4$ gas etching treatment under the condition shown in Table 6 as in above-described (c). Then, the inside of the equipment was purged by Ar gas.

Then, the coated cutting tools 8 to 13 were manufactured by forming the $Al_2O_3$ layer of the upper layer in the intended layer thickness shown in Table 9 under the 3-steps-condition shown in Table 7 as in above-described (d).

For the comparison purpose, the comparative coated cutting tools 1 to 7 shown in Table 10 were manufactured by forming layers in the same condition for the coated cutting tools 1 to 7 of the present invention except for not performing the above-described steps (b1) and (c) for the coated cutting tools 1 to 7 of the present invention.

In addition, for the comparison purpose, the comparative coating tools 8 to 13 shown in Table 11 were manufactured. They were manufactured by forming layers in the same condition for the coated cutting tools 8 to 13 except for: allowing oxygen being included in a condition out of the above-described step (b2) for the coated cutting tools 8 to 13 of the present invention (indicated in Table 5 as "out of the scope of the present invention"); performing the $TiCl_4$ gas etching in a condition out of the above-described step (c) (indicated in Table 6 as "out of the scope of the present invention"); and forming the $Al_2O_3$ layer in a condition out of the above-described step (d) (indicted in Table 7 as "out of the scope of the present invention").

In order to obtain oxygen contents intentionally included in the Ti carbonitride compound layer, a TiCN layer free of the intentionally included oxygen (hereinafter referred as "inevitable oxygen-containing TiCN layer") was chemically vapor deposited separately on the surface of the cutting tool bodies made of tungsten carbide based cemented carbide or titanium carbonitride based cermet in the condition described below as a control.

Reaction gas composition (volume %): 3 to 8% of $TiCl_4$; 1.0 to 2.0% of $CH_3CN$; 40 to 60% of $N_2$; and balance $H_2$
Temperature of reaction atmosphere: 750 to 900° C.
Pressure of reaction atmosphere: 6 to 10 kPa By the vapor deposition described above, the inevitable oxygen-containing TiCN layer having the thickness of 3 μm or more was formed. The inevitably included oxygen content to the total content of Ti, C, N, and O within the depth region deeper than 100 nm from the surface of the inevitable oxygen-containing TiCN layer in the thickness direction was obtained by using an Auger electron spectroscopy. Based on the measurement, the inevitable oxygen content obtained within the accuracy range of the Auger electron spectroscopy was defined as 0.5 atomic %.

Next, on the coated cutting tools 8 to 13 of the present invention and the comparative coated cutting tools 8 to 13, the average oxygen content (=O/(Ti+C+N+O)×100) within the depth region of 500 nm in the thickness direction of the TiCN layer and the average oxygen content (=O/(Ti+C+N+O)×100) within the depth region deeper than 500 nm were measured as follows. First, an electron beam having a diameter of 10 nm was irradiated to the polished cross section of the coated cutting tools from the surface of the outermost surface of the Ti carbonitride compound layer of the lower layer to the range of distance corresponding to the thickness of the Ti carbonitride layer in order to measure the intensities of the Auger peaks of Ti, C, N, and O. Then, the ratio of the intensity of the Auger peak corresponding to O was calculated from the sum of the peak intensities. Finally, the amount of the inevitable oxygen content was subtracted from the calculated value to obtain the oxygen content of the TiCN layer. The values obtained as described above are shown in Tables 9 and 11.

Also, on the coated cutting tools 1 to 13 of the present invention and the comparative coated cutting tools 1 to 13, the $Al_2O_3$ crystal grains contacting to the interface between the lower and upper layers and the TiCN crystal grains at the outermost surface layer of the lower layer were identified using an electric field emitting scanning electron microscope and an electron backscatter diffraction image system. Then, the ratio value at the interface between the lower and upper layers, (Number of $Al_2O_3$ crystal grains)/(Number of Ti compound crystal grains), was obtained by measuring the numbers of the $Al_2O_3$ crystal grains and the TiCN crystal grains existing within the width of 50 μm at the interface between the lower and upper layers parallel to the surface of the cutting tool body.

More specifically, the identification of $Al_2O_3$ crystal grains at the interface between the lower and upper layers and the TiCN crystal grains of the outermost surface of the lower layer were performed as described below.

In the case of identification of the $Al_2O_3$ crystal grains, an electron beam was irradiated to each of hexagonal $Al_2O_3$ crystal grains of the aluminum oxide upper layer within a measurement area on the polished cross section with an electric field emitting scanning electron microscope and an electron backscatter diffraction image system, and the inclinations of the normal lines of the (0001) planes and the (10-10) planes, which were crystal planes of the above-mentioned crystal grains, to the normal line of the surface of the cutting tool body were measured. Then, based on the obtained inclinations, angles of intersections between the normal lines of the (0001) planes of the adjacent crystal grains at the intersection were calculated. Also, angles of intersections between the normal lines of the (10-10) planes of the adjacent crystal grains were calculated in the same way. Then, when the angles of the intersections were 2° or more, the adjacent crystal grains were identified as two individual crystal grains.

In the case of identification of the TiCN crystal grains, an electron beam was irradiated to each of the crystal grains of the outermost surface layer of the Ti compound layer within a measurement area on the polished cross section with an electric field emitting scanning electron microscope, and the inclinations of the normal lines of the (001) planes and the (011) planes, which were crystal planes of the above-mentioned crystal grains, to the normal line of the surface of the cutting tool body were measured. Then, based on the obtained inclinations, angles of intersections between the normal lines of the (001) planes of the adjacent crystal grains at the intersection were calculated. Also, angles of intersections between the normal lines of the (011) planes of the adjacent crystal grains were calculated in the same way. Then, when the angles of the intersections were 2° or more, the adjacent crystal grains were identified as two individual crystal grains.

These values are shown in Tables 8 and 11.

Furthermore, the average size and the number of the micro-pores of the $Al_2O_3$ crystal grains directly above the interface between the lower and upper layers of the coated cutting tools 1 to 13 of the present invention and the comparative coated cutting tools 1 to 13 were measured with a transmission electron microscope in the dark field observation of the cross section magnified by 500000-fold. The average size of the micro-pores existing within the range of a straight line of 50 μm in parallel with the surface of the cutting tool body was obtained as follows. First, a straight line in parallel with the surface of the cutting tool body was drawn on the micro-pores. Then, the maximum span between the intersections was calculated as the pore size. Then, pore sizes existing within the straight line of 50 μm were calculated by the method described above. Then, by calculating the average value of the sizes, the average size of the micro-pores was obtained. The number of the micro-pores was expressed as the number existing within the straight line of 50 μm.

These values are shown in Tables 8 and 11.

In addition, in regard with the $Al_2O_3$ crystal grains directly above the interface between the lower and upper layers of the hard coating layer, an area ratio of the $Al_2O_3$ crystal grains oriented to the (11-20) plane was measured with an electric field emitting scanning electron microscope by following the procedure described below.

First, the measurement areas of the polished cross section of the surface-coated cutting tools 1 to 13 of the present invention and the comparative coated cutting tools 1 to 13 were set in the microscope tube of the electric field emitting scanning electron microscope. The measurement area included the area from the interface between the lower and upper layers to 0.3 μm deep in the depth direction vertically, and within 50 μm wide in parallel with the surface of the cutting tool body horizontally (dimension: 0.3 μm×50 μm). Next, inclinations of normal lines of (11-20) planes of the hexagonal $Al_2O_3$ crystal grains relative to a normal line of the surface of the cutting tool body were measured within the measurement area of 0.3 μm×50 μm at an interval of 0.1 μm/step with an electron backscatter diffraction image system by irradiating an electron beam to each of hexagonal $Al_2O_3$ crystal grains existing within the measurement area of the polished cross section. The acceleration voltage for the electron beam was 15 kV. The incident angle of the electron beam was 70°. The irradiation current for the electron beam was 1 nA. Based on these measurements, the area ratio of crystal grains ($Al_2O_3$ crystal grains oriented to the (11-20) plane) having the inclinations of the normal lines of (11-20) planes being 0 to 10° was measured.

These values are shown in Tables 8 and 11.

Figure 4:
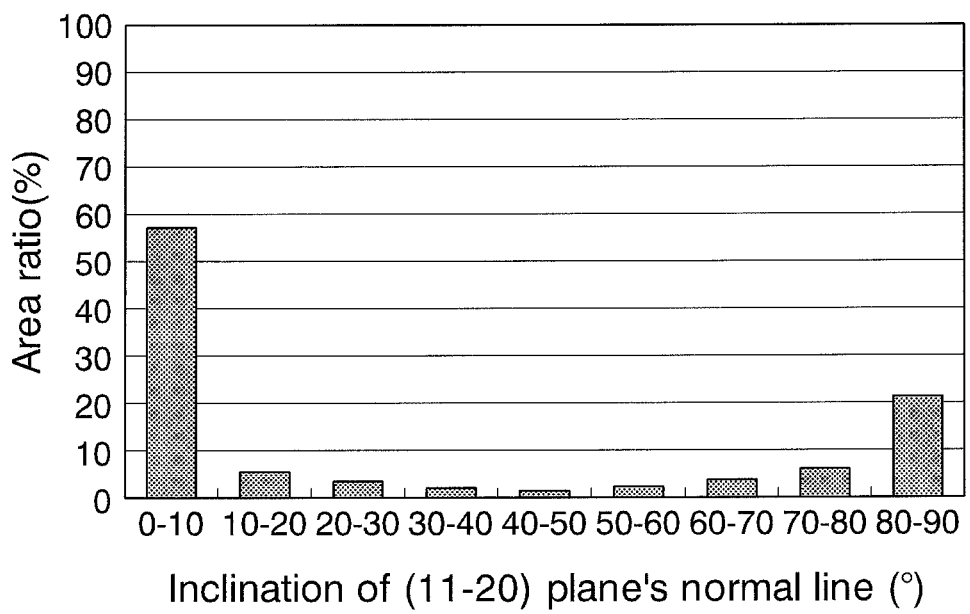
FIG. 4 is a frequency distribution graph of a inclination of the normal line of a (11-20) plane, which is a crystal plane of $Al_2O_3$ crystal grain of the upper layer, to the normal line of the surface of the cutting tool body in the surface-coated cutting tool of an embodiment of the present invention.
Figure 5:
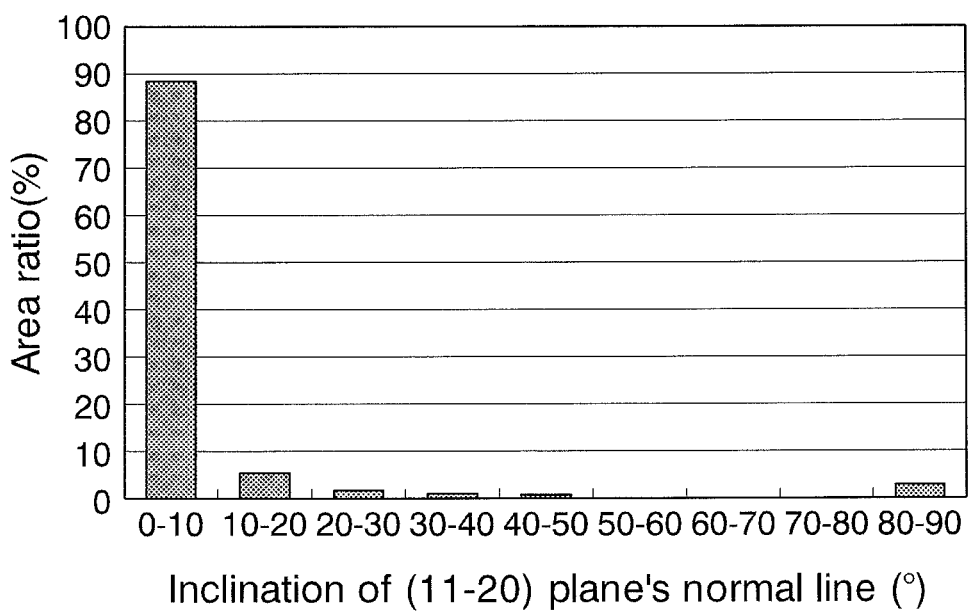
FIG. 5 is a graph of measurement results of the area ratio of the coated cutting tool 10 of the present invention.

The graph of the measurement results of the coated cutting tool 10 of the present invention is shown in FIG. 4.

In addition, in regard with the are ratio of $Al_2O_3$ crystal grains oriented to the (0001) plane in the entire upper layer of the hard coating layer of the coated cutting tools 1 to 13 of the present invention and the comparative coated cutting tools 1 to 13, the area ratio was obtained by: irradiating an electron beam to each of hexagonal $Al_2O_3$ crystal grains of the entire upper layer within a measurement area on the polished cross section with an electric field emitting scanning electron microscope as in the case explained above; measuring inclinations of normal lines of (0001) planes of the hexagonal $Al_2O_3$ crystal grains relative to a normal line of the surface of the cutting tool body; and measuring the area ratio of the crystal grains ($Al_2O_3$ crystal grains oriented to the (0001) plane) having the inclinations of the normal lines of (0001) plane being 0 to 10°.

The "entire upper layer" means a part of the measurement area ranging from the interface of the lower and upper layers to the outermost surface of the upper layer. Thus, the part of the measurement area corresponding to the "entire upper layer" includes the part of the measurement area where the $Al_2O_3$ crystal grains oriented to the (11-20) plane exist above the interface directly. These values are shown in Tables 8 and 11.

Also, thicknesses of each constituting layer of the hard coating layer of the coated cutting tools 1 to 13 of the present invention and the comparative coated cutting tools 1 to 13 were measured with an electron scanning microscope (measurement in the vertical cross section). In each layer, the thickness was substantially the same average layer thickness as the intended layer thickness (the average value was obtained from 5-point measurement).

TABLE 1

| | Type | | Blend composition (mass %) | | | | | | | |
| --- | --- | --- | --- | --- | --- | --- | --- | --- | --- | --- |
| | | | Co | TiC | ZrC | VC | TaC | NbC | $Cr_3C_2$ | TiN | WC |
| Cutting tool body | A | | 5.0 | 2 | — | — | 5 | 1 | 0.4 | 1.5 | Balance |
| | B | | 5.7 | — | — | — | 1.5 | 0.5 | — | — | Balance |
| | C | | 6.0 | — | — | — | — | — | 0.3 | — | Balance |

TABLE 1-continued

| Type | Blend composition (mass %) | | | | | | | | |
|---|---|---|---|---|---|---|---|---|---|
| | Co | TiC | ZrC | VC | TaC | NbC | $Cr_3C_2$ | TiN | WC |
| D | 8.5 | — | 3 | — | 4 | — | — | — | Balance |
| E | 10.5 | 3 | — | — | 4.5 | 0.5 | — | 2.5 | Balance |
| F | 12.0 | 4 | — | 0.2 | — | 6 | 0.8 | — | Balance |

TABLE 2

| | Type | Blend composition (mass %) | | | | | | | |
|---|---|---|---|---|---|---|---|---|---|
| | | Co | Ni | ZrC | TaC | NbC | $Mo_2C$ | WC | TiCN |
| Cutting tool body | a | 13 | 5 | — | 10 | — | 10 | 16 | Balance |
| | b | 8 | 7 | — | 5 | — | 7.5 | — | Balance |
| | c | 5 | — | — | — | — | 6 | 10 | Balance |
| | d | 10 | 5 | — | 11 | 2 | — | — | Balance |
| | e | 9 | 4 | 1 | 8 | — | 10 | 10 | Balance |
| | f | 12 | 5.5 | — | 10 | — | 9.5 | 14.5 | Balance |

TABLE 3

| Lower layer (Ti compound layer) | | Formation condition (pressure and temperature in reaction atmosphere are shown as kPa and ° C., respectively) | | |
|---|---|---|---|---|
| | Intended composition (Numbers indicate atomic | Reaction gas composition | Reaction atmosphere | |
| Type | ratio) | (volume %) | Pressure | Temperature |
| TiC layer | TiC | $TiCl_4$: 4.2%, $CH_4$: 8.5%, $H_2$: balance | 7 | 1020 |
| TiN layer (first layer) | TiN | $TiCl_4$: 4.2%, $N_2$: 30%, $H_2$: balance | 30 | 900 |
| TiN layer (other than the first layer) | TiN | $TiCl_4$: 4.2%, $N_2$: 35%, $H_2$: balance | 50 | 1040 |
| I-TiCN layer | $TiC_{0.5}N_{0.5}$ | $TiCl_4$: 4.2%, $N_2$: 20%, $CH_3CN$: 0.6%, $H_2$: balance | 7 | 880 |
| TiCN layer | $TiC_{0.5}N_{0.5}$ | $TiCl_4$: 4.2%, $N_2$: 20%, $CH_4$: 4%, $H_2$: balance | 12 | 1000 |
| TiCO layer | $TiC_{0.5}O_{0.5}$ | $TiCl_4$: 4.2%, CO: 4%, $H_2$: balance | 7 | 1020 |
| TiCNO layer | $TiC_{0.2}N_{0.3}O_{0.5}$ | $TiCl_4$: 4.2%, CO: 4%, $CH_4$: 3%, $N_2$: 20%, $H_2$: balance | 20 | 1020 |

TABLE 4

| Lower layer surface treatment type | | Treatment condition (pressure and temperature in reaction atmosphere are shown as kPa and ° C., respectively) | | | |
|---|---|---|---|---|---|
| | | Reaction gas composition (volume %) | Reaction atmosphere Pressure | Temperature | Treatment time (min) |
| A | $AlCl_3$ gas etching | $AlCl_3$: 0.1%, $H_2$: balance | 8 | 900 | 5 |
| | CO + NO mixed gas oxidation treatment | CO: 10%, NO: 5%, $H_2$: balance | 8 | 900 | 1 |
| B | $AlCl_3$ gas etching | $AlCl_3$: 0.5%, $H_2$: balance | 10 | 800 | 2 |
| | CO + NO mixed gas oxidation treatment | CO: 5%, NO: 5%, $H_2$: balance | 10 | 800 | 2 |
| C | $AlCl_3$ gas etching | $AlCl_3$: 1%, $H_2$: balance | 6 | 750 | 1 |
| | CO + NO mixed gas oxidation treatment | CO: 5%, NO: 10%, $H_2$: balance | 6 | 750 | 5 |

TABLE 5

| Oxygen-containing TiCN layer type | Formation condition (pressure and temperature in reaction atmosphere are shown as kPa and ° C., respectively) | | | | CO gas supplied 5 to 30 minutes before the end of deposition time (volume %) |
|---|---|---|---|---|---|
| | Reaction gas composition (volume %) | | Reaction atmosphere Pressure | Temperature | |
| A | $TiCl_4$: 3%, $CH_3CN$: 2%, $N_2$: 40%, $H_2$: balance | | 8 | 900 | 5 |
| B | $TiCl_4$: 5%, $CH_3CN$: 1%, $N_2$: 50%, $H_2$: balance | | 6 | 870 | 3 |

TABLE 5-continued

| Oxygen-containing TiCN layer type | Formation condition (pressure and temperature in reaction atmosphere are shown as kPa and °C., respectively) | | | CO gas supplied 5 to 30 minutes before the end of deposition time (volume %) |
|---|---|---|---|---|
| | Reaction gas composition (volume %) | Reaction atmosphere | | |
| | | Pressure | Temperature | |
| C | TiCl$_4$: 8%, CH$_3$CN: 1.5%, N$_2$: 60%, H$_2$: balance | 10 | 750 | 1 |
| D (out of the scope of the present invention) | TiCl$_4$: 2.5%, CH$_3$CN: 1.2%, N$_2$: 35%, CO$_2$: 2.5%, CO: 2.5%, H$_2$: balance | 8 | 800 | — |

TABLE 6

| TiCl$_4$ gas etching type | Etching condition (pressure and temperature in reaction atmosphere are shown as kPa and °C., respectively) | | |
|---|---|---|---|
| | Reaction gas composition (volume %) | Pressure | Temperature |
| A | TiCl$_4$: 1%, H$_2$: 20%, balance: Ar | 6 | 900 |
| B | TiCl$_4$: 3%, H$_2$: 30%, balance: Ar | 8 | 800 |
| C | TiCl$_4$: 5%, H$_2$: 10%, balance: Ar | 10 | 750 |
| D (out of the scope of the present invention) | TiCl$_4$: 5%, H$_2$: balance | 6 | 1000 |
| E (out of the scope of the present invention) | TiCl$_4$: 5%, balance: Ar | 8 | 1020 |

TABLE 7

| Al$_2$O$_3$ layer type | | Deposition condition (pressure, temperature, and time are shown as kPa, °C., and minutes, respectively) | | | |
|---|---|---|---|---|---|
| | | Reaction gas composition (volume %) | Pressure | Temperature | Time |
| A | 1st step | AlCl$_3$: 1%, CO$_2$: 10%, balance: H$_2$ | 6 | 960 | 5 |
| | 2nd step | AlCl$_3$: 5%, balance: Ar | 6 | 960 | 5 |
| | 3rd step | AlCl$_3$: 1%, CO$_2$: 5%, HCl: 1%, H$_2$S: 0.5%, balance H$_2$ | 6 | 960 | — |
| B | 1st step | AlCl$_3$: 3%, CO$_2$: 20%, balance: H$_2$ | 8 | 1000 | 30 |
| | 2nd step | AlCl$_3$: 3%, balance: Ar | 8 | 1000 | 3 |
| | 3rd step | AlCl$_3$: 3%, CO$_2$: 7%, HCl: 2%, H$_2$S: 0.8%, balance H$_2$ | 8 | 1000 | — |
| C | 1st step | AlCl$_3$: 2%, CO$_2$: 30%, balance: H$_2$ | 10 | 1040 | 15 |
| | 2nd step | AlCl$_3$: 1%, balance: Ar | 10 | 1040 | 1 |
| | 3rd step | AlCl$_3$: 5%, CO$_2$: 15%, HCl: 5%, H$_2$S: 1%, balance H$_2$ | 10 | 1040 | — |
| D (out of the scope of the present invention) | | AlCl$_3$: 2%, CO$_2$: 5%, HCl: 2%, H$_2$S: 0.2%, balance H$_2$ | 6 | 1020 | — |

TABLE 8

| | | | Hard coating layer | | | | | | | |
|---|---|---|---|---|---|---|---|---|---|---|
| | | | Lower layer (Ti compound layer) (number in parentheses indicates intended thickness of layer in μm) | | | | Interface between lower and upper layers | | Outermost surface layer of the lower layer (oxygen-containing TiCN layer) | |
| | | | | | | | | | | Average oxygen content (atomic %) |
| Type | Cutting tool body symbol | | 1st layer | 2nd layer | 3rd layer | 4th layer | Lower layer surface treatment type | Layer Type | Layer thickness (μm) | The depth region deeper than 500 nm | To the depth region of 500 nm |
| Coated cutting tools of the | 1 | A | TiC (0.1) | l—TiCN (2.7) | TiCO (0.2) | — | B | — | — | — | — |
| | 2 | a | TiN (0.3) | l—TiCN (7.0) | TiCNO (0.7) *3 | — | C | — | — | — | — |

TABLE 8-continued

| | | | | Hard coating layer | | | | | | |
|---|---|---|---|---|---|---|---|---|---|---|
| | | | | Lower layer (Ti compound layer) (number in parentheses indicates intended thickness of layer in μm) | | | | Lower layer surface treatment type | | |
| Type | | Cutting tool body symbol | 1st layer | 2nd layer | 3rd layer | 4th layer | | | | |
| present invention | 3 | B | TiCN (0.2) | I—TiCN (5) | — | — | A | | | |
| | 4 | b | TiN (0.2) | I—TiCN (6.8) | TiCN (0.3) | — | C | | | |
| | 5 | C | TiN (0.5) | I—TiCN (11) | — | — | — | | | |
| | 6 | c | TiN (0.5) | TiC (1.0) | I—TiCN (17.5) | TiCO (1.0) | A | | | |
| | 7 | D | TiN (1) | I—TiCN (14) | TiCNO (0.3) | TiCO (0.2) | B | | | |

| | | | Hard coating layer | | | | | |
|---|---|---|---|---|---|---|---|---|
| | | | Interface between lower and upper layers | | | | Upper layer (Al₂O₃ layer) | |
| | | | Al₂O₃ crystal grains directly above the interface | | | | | |
| Type | | Etching type | Type | Area ratio of Al₂O₃ crystal grains oriented to the (11-20) plane (area %) | Crystal grain ratio *1 | Micro-pore distribution *2 | Type | Layer thickness (μm) | Area ratio of Al₂O₃ crystal grains oriented to the (0001) plane (area %) |
| Coated cutting tools of the present invention | 1 | A | B | 70 | 0.5 | No micro-pores | A | 2 | 45 |
| | 2 | B | A | 66 | 0.3 | No micro-pores | B | 7.5 | 99 |
| | 3 | C | C | 57 | 0.1 | No micro-pores | C | 5 | 65 |
| | 4 | B | A | 46 | 0.2 | No micro-pores | B | 15 | 92 |
| | 5 | C | B | 55 | 0.4 | No micro-pores | C | 10.5 | 87 |
| | 6 | B | C | 30 | 0.3 | No micro-pores | B | 12 | 70 |
| | 7 | A | A | 45 | 0.5 | No micro-pores | A | 6.5 | 50 |

*1. The crystal grain ratio indicates the value, (Number of Al₂O₃ crystal grains)/(Number of Ti compound crystal grains).
*2. The micro-pore distribution indicates the pore size and the number of pores per μm².
*3. The TiCNO layer is distinguished from the oxygen-containing TiCN layer since the oxygen content of the TiCNO layer is around 25 atomic % as shown in Table 3 and evidently higher than that of the oxygen-containing TiCN layer.

TABLE 9

| | | | Hard coating layer | | | | | | | |
|---|---|---|---|---|---|---|---|---|---|---|
| | | | | | | | | Interface between lower and upper layers | | |
| | | | | | | | | Outermost surface layer of the lower layer (oxygen-containing TiCN layer) | | |
| | | | Lower layer | | | | | | Average oxygen content (atomic %) | |
| | | | (Ti compound layer) (number in parentheses indicates intended thickness of layer in μm) | | | | Lower layer surface treatment type | | | |
| Type | | Cutting tool body symbol | 1st layer | 2nd layer | 3rd layer | 4th layer | | Forming type | Layer thickness (μm) | The depth region deeper than 500 nm | To the depth region of 500 nm |
| Coated cutting tools of the present invention | 8 | d | TiC (0.1) | — | — | — | | B | 2.9 | 0 *3 | 1.8 |
| | 9 | E | TiN (0.3) | — | — | — | | A | 6.7 | 0 *3 | 3 |
| | 10 | e | TiN (0.1) | — | — | — | | C | 14.5 | 0 *3 | 0.5 |
| | 11 | F | TiN (0.2) | I—TiCN (6.8) | — | — | | A | 1.5 | 0 *3 | 3 |

TABLE 9-continued

| | | | | | | | | | | |
|---|---|---|---|---|---|---|---|---|---|---|
| 12 | | TiN (0.5) | I—TiCN (11) | — | — | — | B | 5 | 0 *3 | 1.8 |
| 13 | f | TiN (0.5 | I—TiCN (14.5) | — | — | — | C | 2 | 0 *3 | 0.5 |

| | | Hard coating layer | | | | | | |
|---|---|---|---|---|---|---|---|---|
| | | Interface between lower and upper layers | | | | | Upper layer (Al$_2$O$_3$ layer) | |
| | | Al$_2$O$_3$ crystal grains directly above the interface | | | | | | |
| Type | | Etching type | Deposition type | Area ratio of Al$_2$O$_3$ crystal grains oriented to the (11-20) plane (area %) | Crystal grain ratio *1 | Micro-pore distribution *2 | Deposition type | Layer thickness (μm) | Area ratio of Al$_2$O$_3$ crystal grains oriented to the (0001) plane (area %) |
| Coated cutting tools of the present invention | 8 | A | B | 70 | 0.06 | No micro-pores | A | 2 | 48 |
| | 9 | B | A | 66 | 0.05 | No micro-pores | B | 7.5 | 95 |
| | 10 | C | C | 57 | 0.07 | No micro-pores | C | 5 | 88 |
| | 11 | B | A | 46 | 0.01 | No micro-pores | B | 15 | 97 |
| | 12 | C | B | 55 | 0.04 | No micro-pores | C | 10.5 | 83 |
| | 13 | B | C | 32 | 0.02 | No micro-pores | B | 12 | 95 |

*1. The crystal grain ratio indicates the value, (Number of Al$_2$O$_3$ crystal grains)/(Number of Ti compound crystal grains).
*2. The micro-pore distribution indicates the pore size and the number of pores per um$^2$.
*3. "The average oxygen content is 0 atomic %" means that only the unavoidable trace amount of oxygen is detected.

TABLE 10

| | | | Hard coating layer | | | | | | |
|---|---|---|---|---|---|---|---|---|---|
| | | | | | | Interface between lower and upper layers | | | |
| | | | | | | Outermost surface layer of the lower layer (oxygen-containing TiCN layer) | | | |
| | | Lower layer (Ti compound layer) (number in parentheses indicates intended thickness of layer in μm) | | | | | | Average oxygen content (atomic %) | |
| Type | Cutting tool body symbol | 1st layer | 2nd layer | 3rd layer | 4th layer | Lower layer surface treatment type | Forming type | Layer thickness (μm) | The depth region deeper than 500 nm | To the depth region of 500 nm |
| Comparative coated cutting tools | 1 | Same as the coated cutting tool 1 of the present invention | | | | — | — | — | — | — |
| | 2 | Same as the coated cutting tool 2 of the present invention | | | | — | — | — | — | — |
| | 3 | Same as the coated cutting tool 3 of the present invention | | | | — | — | — | — | — |
| | 4 | Same as the coated cutting tool 4 of the present invention | | | | — | — | — | — | — |
| | 5 | Same as the coated cutting tool 5 of the present invention | | | | — | — | — | — | — |
| | 6 | Same as the coated cutting tool 6 of the present invention | | | | — | — | — | — | — |
| | 7 | Same as the coated cutting tool 7 of the present invention | | | | — | — | — | — | — |

TABLE 10-continued

| | | Hard coating layer | | | | | | | |
|---|---|---|---|---|---|---|---|---|---|
| | | Interface between lower and upper layers | | | | | Upper layer (Al$_2$O$_3$ layer) | | |
| | | Al$_2$O$_3$ crystal grains directly above the interface | | | | | | | |
| Type | | Etching type | Deposition type | Area ratio of Al$_2$O$_3$ crystal grains oriented to the (11-20) plane (area %) | Crystal grain ratio *1 | Micro-pore distribution *2 | Deposition type | Layer thickness (μm) | Area ratio of Al$_2$O$_3$ crystal grains oriented to the (0001) plane (area %) |
| Comparative coated cutting tools | 1 | — | — | 93 | 1.0 | 30 nm 2 pores/μm$^2$ | A | 2 | 3 |
| | 2 | — | — | 1 | 1.5 | 20 nm 3 pores/μm$^2$ | B | 7.5 | 2 |
| | 3 | — | — | 7 | 2 | 50 nm 2 pores/μm$^2$ | C | 5 | 0 |
| | 4 | — | — | 2 | 2.5 | 50 nm 2 pores/μm$^2$ | B | 15 | 8 |
| | 5 | — | — | 10 | 2.2 | 25 nm 3 pores/μm$^2$ | C | 10.5 | 6 |
| | 6 | — | — | 0 | 1.2 | 20 nm 3 pores/μm$^2$ | B | 12 | 3 |
| | 7 | — | — | 89 | 0.9 | 20 nm 4 pores/μm$^2$ | A | 6.5 | 2 |

*1. The crystal grain ratio indicates the value, (Number of Al$_2$O$_3$ crystal grains)/(Number of Ti compound crystal grains).
*2. The micro-pore distribution indicates the pore size and the number of pores per μm$^2$.

TABLE 11

| | | Hard coating layer | | | | | | | | |
|---|---|---|---|---|---|---|---|---|---|---|
| | | | Lower layer (Ti compound layer) (number in parentheses indicates intended thickness of layer in μm) | | | | Interface between lower and upper layers | | | |
| | | | | | | | Outermost surface layer of the lower layer (oxygen-containing TiCN layer) | | | |
| | | | | | | | | | Average oxygen content (atomic %) | |
| Type | | Cutting tool body symbol | 1st layer | 2nd layer | 3rd layer | 4th layer | Lower layer surface treatment type | Layer Forming type | Layer thickness (μm) | The depth region deeper than 500 nm | To the depth region of 500 nm |
| Comparative coated cutting tools | 8 | Same as the coated cutting tool 8 of the present invention | | | | — | D | 2 | 1.8 | 1.9 |
| | 9 | Same as the coated cutting tool 9 of the present invention | | | | — | D | 7 | 1.9 | 2 |
| | 10 | Same as the coated cutting tool 10 of the present invention | | | | — | D | 15 | 2 | 2.2 |
| | 11 | Same as the coated cutting tool 11 of the present invention | | | | — | D | 18 | 1.9 | 2.1 |
| | 12 | Same as the coated cutting tool 12 of the present invention | | | | — | D | 6 | 1.8 | 1.9 |
| | 13 | Same as the coated cutting tool 13 of the present invention | | | | — | D | 3 | 1.7 | 1.8 |

TABLE 11-continued

| | | | | Hard coating layer | | | | | |
| --- | --- | --- | --- | --- | --- | --- | --- | --- | --- |
| | | | Interface between lower and upper layers | | | | | | |
| | | | Al$_2$O$_3$ crystal grains directly above the interface | | | | Upper layer (Al$_2$O$_3$ layer) | | |
| Type | | Etching type | Deposition type | Area ratio of Al$_2$O$_3$ crystal grains oriented to the (11-20) plane (area %) | Crystal grain ratio *1 | Micro-pore distribution *2 | Deposition type | Layer thickness (μm) | Area ratio of Al$_2$O$_3$ crystal grains oriented to the (0001) plane (area %) |
| Comparative coated cutting tools | 8 | D | D | 0 | 1.5 | 30 nm 3 pores/μm$^2$ | D | 2 | 0 |
| | 9 | E | D | 1 | 1.7 | 20 nm 4 pores/μm$^2$ | D | 7.5 | 1 |
| | 10 | D | D | 2 | 2.2 | 50 nm 2 pores/μm$^2$ | D | 5 | 2 |
| | 11 | D | D | 0 | 2.3 | 50 nm 2 pores/μm$^2$ | D | 15 | 0 |
| | 12 | E | D | 1 | 2.1 | 25 nm 3 pores/μm$^2$ | D | 10.5 | 1 |
| | 13 | E | D | 2 | 1.4 | 20 nm 3 pores/μm$^2$ | D | 12 | 0 |

*1. The crystal grain ratio indicates the value, (Number of Al$_2$O$_3$ crystal grains)/(Number of Ti compound crystal grains).
*2. The micro-pore distribution indicates the pore size and the number of pores per μm$^2$.

Next, cutting tests were performed on the coated cutting tools 1 to 13 of the present invention and the comparative cutting tools 1 to 13. In each of cutting tests, the coated cutting tool was fixed on the apical part of a steel tool in a screwed state with a fixation jig. In each of cutting tests, the width of the flank wear in the cutting edge was measured.

In the cutting condition A, a dry high-speed and intermittent cutting test on a nickel-chromium-molybdenum alloy steel was performed in the condition described below (the normal cutting speed is 300 m/min).

Work: JIS•S45C with 4 grooves with an equal interval along with the longitudinal direction
Cutting speed: 350 m/min
Cutting depth: 2 mm
Feed: 0.4 mm/rev
Cutting time: 5 minutes In the cutting condition B, a dry high-speed and heavy cutting test on a nickel-chromium-molybdenum alloy steel was performed in the condition described below (the normal cutting speed and the cutting depth are 250 m/min and 2 mm/rev, respectively).

Work: Round bar of JIS•SNCM439
Cutting speed: 370 m/min
Cutting depth: 3.5 mm
Feed: 0.25 mm/rev
Cutting time: 8 minutes In the cutting condition C, a dry high-speed and high-cutting-depth cutting test on a ductile iron steel was performed in the condition described below (the normal cutting speed and the cutting depth are 250 m/min and 1.5 mm/rev, respectively).

Work: Round bar of JIS•FCD700
Cutting speed: 320 m/min
Cutting depth: 2.5 mm
Feed: 0.2 mm/rev
Cutting time: 5 minutes The measurement results were indicated in Table 12.

TABLE 12

| | | Width of flank wear (mm) | | | | | Cutting test result (min) | | |
| --- | --- | --- | --- | --- | --- | --- | --- | --- | --- |
| Type | | Cutting condition (A) | Cutting condition (B) | Cutting condition (C) | Type | | Cutting condition (A) | Cutting condition (B) | Cutting condition (C) |
| Coated cutting tools of the present invention | 1 | 0.33 | 0.32 | 0.33 | Comparative coated cutting tools | 1 | 0.5* | 1.0* | 1.2* |
| | 2 | 0.23 | 0.23 | 0.24 | | 2 | 2.2** | 2.5* | 2.5** |
| | 3 | 0.24 | 0.25 | 0.25 | | 3 | 1.0* | 0.5* | 0.5* |
| | 4 | 0.31 | 0.30 | 0.32 | | 4 | 0.5** | 1.2** | 1.5** |
| | 5 | 0.30 | 0.31 | 0.33 | | 5 | 3.2* | 2.0* | 1.8** |
| | 6 | 0.27 | 0.28 | 0.26 | | 6 | 1.4** | 1.5** | 0.5** |
| | 7 | 0.25 | 0.24 | 0.23 | | 7 | 1.8* | 2.8* | 2.2* |
| | 8 | 0.23 | 0.22 | 0.24 | | 8 | 1.6* | 1.5** | 2.4* |
| | 9 | 0.13 | 0.14 | 0.15 | | 9 | 1.2* | 0.5* | 1.8** |
| | 10 | 0.14 | 0.13 | 0.14 | | 10 | 2.8* | 1.4* | 0.7** |
| | 11 | 0.18 | 0.17 | 0.16 | | 11 | 2.5** | 1.3** | 1.1** |

TABLE 12-continued

| Type | Width of flank wear (mm) | | | Type | Cutting test result (min) | | |
| | Cutting condition (A) | Cutting condition (B) | Cutting condition (C) | | Cutting condition (A) | Cutting condition (B) | Cutting condition (C) |
|---|---|---|---|---|---|---|---|
| 12 | 0.17 | 0.18 | 0.18 | 12 | 0.8* | 1.3* | 3.1** |
| 13 | 0.18 | 0.19 | 0.19 | 13 | 0.6** | 0.9** | 2.6** |

*The value indicates the cutting time until reaching to its service life by flaking occurring in the hard-coating layer
The value indicates the cutting time until reaching to its service life by chipping occurring in the hard-coating layer The results indicated in Tables 8, 9, and 12 demonstrate followings. First, the ratio of the number of $Al_2O_3$ crystal grains directly above the interface between the lower and upper layers to the number of the oxygen-containing TiCN crystal grains was in the range from 0.01 to 0.5 in the coated cutting tools 1 to 13 of the present invention. Also, the area ratio of the $Al_2O_3$ crystal grains oriented to the (11-20) plane to the $Al_2O_3$ crystal grains directly above the interface between the lower and upper layers was in the range of 30 to 70 area %. Furthermore, the area ratio of the $Al_2O_3$ crystal grains oriented to the (0001) plane to the $Al_2O_3$ crystal grains in the entire upper layer was 45% area % or more. In the coated cutting tools 1 to 13** of the present invention, there was less micro-pores formed in the upper layer, and the sizes of the micro-pores were small. Therefore, the hard coating layer of the coated cutting tools of the present invention showed an excellent flaking resistance and an excellent chipping resistance even if they were used in the high-speed heavy cutting condition, which involves high heat generation and a high load applied on the cutting edge, or the high-speed intermittent cutting condition, which involves an intermittent and impacting load applied on the cutting edge.

In any of the coated cutting tools 8 to 13 of the present invention, the oxygen-containing TiCN layer, which is the outermost surface layer of the lower layer, includes oxygen in the oxygen content of 0.3 to 3 atomic % only in the depth region of 500 nm.

Contrary to that, in the comparative coated cutting tools 1 to 13, it was obvious that they reached to their tool life in a short period of time because of flaking or chipping occurred in their hard coating layer in the high-speed heavy cutting machining or the high-speed intermittent cutting machining.

INDUSTRIAL APPLICABILITY

As explained above, the coated cutting tool of the present invention exhibits an excellent cutting performance for long-term use without occurrence of flaking or chipping of the hard coating layer not only in continuous or intermittent cutting of a variety of steel or casted iron under normal conditions but also under severe cutting conditions such as a high-speed heavy cutting and a high-speed intermittent cutting, in which a high, intermittent, and impacting load is applied to its cutting edge. Thus, it can be utilized in order to sufficiently improve the performance of the cutting apparatus. Also, it can be utilized for power-saving, energy-saving, and reducing cost sufficiently.

BRIEF DESCRIPTION OF THE REFERENCE SYMBOLS

1: Coated cutting tool
2: Upper layer ($Al_2O_3$ layer)
3: Lower layer (Ti compound layer)
4: Hard coating layer
5: Cutting tool body
6: Hexagonal $Al_2O_3$ crystal grain
7: (11-20) plane of hexagonal $Al_2O_3$ crystal grain
8: Surface of the cutting tool body
9: Normal line of the surface of the cutting tool body
10: Normal line of (11-20) plane of hexagonal $Al_2O_3$ crystal grain
11: Inclination of the normal line of (11-20) plane to the normal line of the surface of the cutting tool body

The invention claimed is:
1. A surface-coated cutting tool comprising:
a cutting tool body made of tungsten carbide-based cemented carbide or titanium carbonitride-based cermet; and
a hard coating layer chemically vapor-deposited on a surface of the cutting tool body, wherein
the hard coating layer comprises a lower layer formed on the surface of the cutting tool body and an upper layer formed on the lower layer,
(a) the lower layer is a Ti compound layer, which comprises one or more layers selected from the group consisting of a Ti carbide layer, a Ti nitride layer, a Ti carbonitride layer, a Ti carboxide layer, and a Ti oxycarbonitride layer, with a total average thickness of 3 to 20 μm,
(b) the upper layer is an $Al_2O_3$ layer, which has an α crystal structure in a chemically vapor-deposited state, with an average thickness of 2 to 15 μm,
(c) an area ratio occupied by hexagonal $Al_2O_3$ crystal grains having the inclinations of the normal lines of (11-20) planes being 0 to 10° is in a range of 30 to 70 area %, wherein the area ratio of the normal lines of (11-20) planes is determined by: preparing a polished cross section of the surface-coated cutting tool perpendicular to the surface of the cutting tool body; irradiating an electron beam to each of hexagonal $Al_2O_3$ crystal grains of the upper layer contacting to an interface between an outermost surface layer of the lower layer and the upper layer within a measurement area on the polished cross section with an electric field emitting scanning electron microscope; and measuring inclinations of normal lines of (11-20) planes of the hexagonal $Al_2O_3$ crystal grains relative to a normal line of the surface of the cutting tool body, and
(d) an area ratio occupied by hexagonal $Al_2O_3$ crystal grains having the inclinations of the normal lines of (0001) plane being 0 to 10° is 45 area % or more, wherein the area of the normal lines of (0001) plane is determined by: irradiating an electron beam to each of hexagonal $Al_2O_3$ crystal grains of the entire upper layer within a measurement area on the polished cross section with an electric field emitting scanning electron microscope; and measuring inclinations of normal lines of (0001) planes of the hexagonal $Al_2O_3$ crystal grains relative to a normal line of the surface of the cutting tool body.

2. The surface-coated cutting tool according to claim 1, wherein the outermost surface layer of the lower layer is made of the Ti carbonitride layer having a thickness of 500 nm or more, oxygen is only included within a depth region of 500 nm of the Ti carbonitride layer in the thickness direction from an interface between the Ti carbonitride layer and the upper layer, and an average oxygen content within the depth region is 0.5 to 3 atomic % with respect to a total atomic content of Ti, C, N, and O included within the depth region.

3. The surface-coated cutting tool according to claim 2, wherein a ratio of the number of $Al_2O_3$ crystal grains directly above the outermost surface layer of the lower layer to the number of crystal grains of the Ti carbonitride layer in the outermost surface layer of the lower layer is 0.01 to 0.5 at the interface between the Ti carbonitride layer, which constitutes the outermost surface layer of the lower layer, and the upper layer.

4. The surface-coated cutting tool according to claim 2, wherein the ratio of the number of $Al_2O_3$ crystal grains directly above the outermost surface layer of the lower layer to the number of crystal grains of the Ti carbonitride layer in the outermost surface layer of the lower layer is 0.01 to 0.07, and the area ratio occupied by hexagonal $Al_2O_3$ crystal grains having the inclinations of the normal lines of (0001) plane being 0 to 10° is 83 to 97 area %.

5. The surface-coated cutting tool according to claim 1, wherein an average number of micro-pores of $Al_2O_3$ crystal grains directly above the interface between the lower layer and the upper layer is less than 1, and wherein the number of micro-pores is defined as a number of micro-pores existing within a range of a straight line of 50 μm in parallel with the surface of the cutting tool body is less than 1.

* * * * *